United States Patent
Hayashi et al.

(10) Patent No.: US 7,473,957 B2
(45) Date of Patent: Jan. 6, 2009

(54) FLOATING GATE NON-VOLATILE MEMORY

(75) Inventors: Yutaka Hayashi, 3-10, Umezono 2-chome, Tsukuba-shi, Ibaraki (JP); Shoji Nakanishi, Chiba (JP); Sumitaka Goto, Chiba (JP)

(73) Assignees: Seiko Instruments Inc. (JP); Yutaka Hayashi (JP)

( * ) Notice: Subject to any disclaimer, the term of this patent is extended or adjusted under 35 U.S.C. 154(b) by 0 days.

(21) Appl. No.: 11/092,794

(22) Filed: Mar. 29, 2005

(65) Prior Publication Data

US 2005/0221553 A1  Oct. 6, 2005

(30) Foreign Application Priority Data

Mar. 30, 2004 (JP) ............................. 2004-097328
Jul. 6, 2004 (JP) ............................. 2004-198841

(51) Int. Cl.
*H01L 27/108* (2006.01)

(52) U.S. Cl. ................. 257/315; 257/314; 257/316; 257/317; 257/E29.129

(58) Field of Classification Search .......... 257/314–317
See application file for complete search history.

(56) References Cited

U.S. PATENT DOCUMENTS 5,892,258 A * 4/1999 Kobatake .................... 257/316

OTHER PUBLICATIONS

Wolf and Tauber p. 265.
Webster's New World Computing Dictionary, Copyright 2003 by Wiley Publishing, Inc., Indianapolis, Indiana. [retrieved on Mar. 9, 2006]. Retrieved from xreferplus.

* cited by examiner

*Primary Examiner*—Jack Chen
*Assistant Examiner*—Matthew L Reames
(74) *Attorney, Agent, or Firm*—Adams & Wilks

(57) ABSTRACT

A floating non-volatile memory has a substrate and source and drain regions disposed in a surface region of the substrate and spaced apart from each other with a channel forming semiconductor region disposed therebetween. A gate insulating film is disposed on the channel forming semiconductor region. A single crystal control region is disposed in the surface region of the substrate and is electrically separated from the channel forming semiconductor region. A control gate insulating film is disposed on the single crystal control region. A floating gate is disposed on the control gate insulating film and is capacitively coupled with the single crystal control region. A chemical-vapor-deposited shield insulating film is formed in a gas atmosphere charge-balanced on the floating gate. A shield conductive film is disposed on the chemical-vapor-deposited shield insulating film and capacitively coupled with the floating gate.

24 Claims, 1 Drawing Sheet

FLOATING GATE NON-VOLATILE MEMORY

BACKGROUND OF THE INVENTION

1. Field of the Invention

The present invention relates to a semiconductor non-volatile memory having a floating gate, and more particularly to a semiconductor non-volatile memory in which a floating gate is provided above a control gate.

2. Description of the Related Art

A non-volatile memory, in which a control gate is provided on an insulating film grown on a floating gate, has a problem in that the insulating film grown on the polycrystalline silicon floating gate has a large leakage current and a small withstand voltage. As a floating gate non-volatile memory for solving the problem, there is disclosed a structure in which: a floating gate is provided on a channel forming semiconductor region sandwiched by a source region and a drain region through an insulating film; the floating gate is extended onto an insulating film grown on a single crystal control region; and the single crystal control region is used as a control gate (refer to JP 57-49148 B, FIG. 3).

On the other hand, there has been separately developed a technique in which an insulating film with a small leakage current and an excellent withstand voltage is formed on a polycrystalline silicon floating gate; however, the technique shares few manufacturing processes with that of a MOS logic. Therefore, the floating gate non-volatile memory having the single crystal control region has been utilized as a non-volatile memory appropriate for being embedded in a MOS logic shortly after JP57-49148B was disclosed. In this case, the single crystal control region is formed in a surface of a semiconductor substrate as a semiconductor region of an opposite conductivity type to a substrate.

In these days, the lowering of a power supply voltage of IC/LSI has progressed, which makes a potential control in a small voltage range of a floating gate important. Thus, the following problem has arisen.

That is, (1) an electric potential of an interconnection, which is arranged above the floating gate (in the state of not contacting with and being separated from the floating gate), has a capacitive coupling with the floating gate. As a result, a gate threshold voltage of a floating gate non-volatile memory measured from a single crystal control region varies.

(2) When even one part in and on an insulating film on the floating gate is included or attached with electric charge, the gate threshold voltage of the floating gate non-volatile memory measured from the single crystal control region varies.

The electric charge included into the insulating film is generated when discharge of a source gas is excited immediately above a wafer in plasma CVD or the like, to deposit the insulating film on the floating gate. The electric charge on the insulating film is generated due to contamination of a surface of the wafer or chip, or discharge from a handling jig.

The effect of the interconnection arrangement is not considered in many cases at the time of design of the floating gate non-volatile memory, and an amount of the included or attached electric charge cannot be predicted. Therefore, the gate threshold voltage of the completed floating gate non-volatile memory measured from the single crystal control region is difficult to predict.

SUMMARY OF THE INVENTION

The present invention has been made in view of the above, and therefore has an object to provide a floating gate non-volatile memory. In order to solve the above-described problems, the present invention provides as a first means a shield conductive film provided above a floating gate through a shield insulating film, and as a second means, for the shield insulating film, an insulating film formed not by a deposition method in which a gas atmosphere containing un-balanced charge particles such as excess electrons or excess ions contacts with a wafer surface, such as plasma CVD, but by a deposition method in which neutral molecules/atoms come flying directly above the wafer, for example, thermal CVD, radical CVD, photo-assisted CVD, or thermal oxidization. Stated otherwise, the shield insulating film is formed by a deposition method in which a gas atmosphere is charged-balanced on the floating gate.

Note that it can be said that the molecules/atoms immediately before thermal decomposition/thermal reaction or those activated in a radical state through photo excitation or the like are positively/negatively charged in the case of being seen microscopically from the result that electrons are further excited to an outer shell orbit from a ground state. However, in the present invention, the state, in which positive and negative charges are substantially balanced on the wafer surface in a macroscopic manner, is termed "neutral molecules/atoms".

By virtue of the first means, the gate threshold voltage is avoided from being affected by the potential of the interconnection provided in the vicinity, or is avoided from being affected by the electric charge attached to the portion above the floating gate after manufacturing.

By virtue of the second means, the electric charge included into the shield insulating film on the floating gate through the manufacturing process can be reduced to the level that causes substantially no problem with the gate threshold voltage. When the influence can be reduced to the level that causes substantially no problem from the practical viewpoint, the shield conductive film does not need to completely cover the floating gate.

The shield insulating film does not mainly determine a coupling rate of the control gate to the floating gate, and thus, can be deposited to the thickness level that satisfies the limitations on a withstand voltage and a leakage current. Accordingly, there can be solved a problem in that the single crystal control region is required.

If necessary, a specified potential can be supplied to the conductive shield film to adjust a gate threshold voltage measured from the single crystal control region.

By supplying a specified potential to the shield conductive film, the absolute value of the potential supplied to the single crystal control region at the time of writing can be decreased, if necessary. As a result, the withstand voltage required for the single crystal control region can be relaxed.

By supplying a specified potential to the conductive shield film, the absolute value of the potential, which is supplied to the drain region or source region at the time of erasure, can be decreased if necessary. As a result, the withstand voltage required for the drain region or source region can be relaxed.

DETAILED DESCRIPTION OF THE PREFERRED EMBODIMENTS

Figure 1:
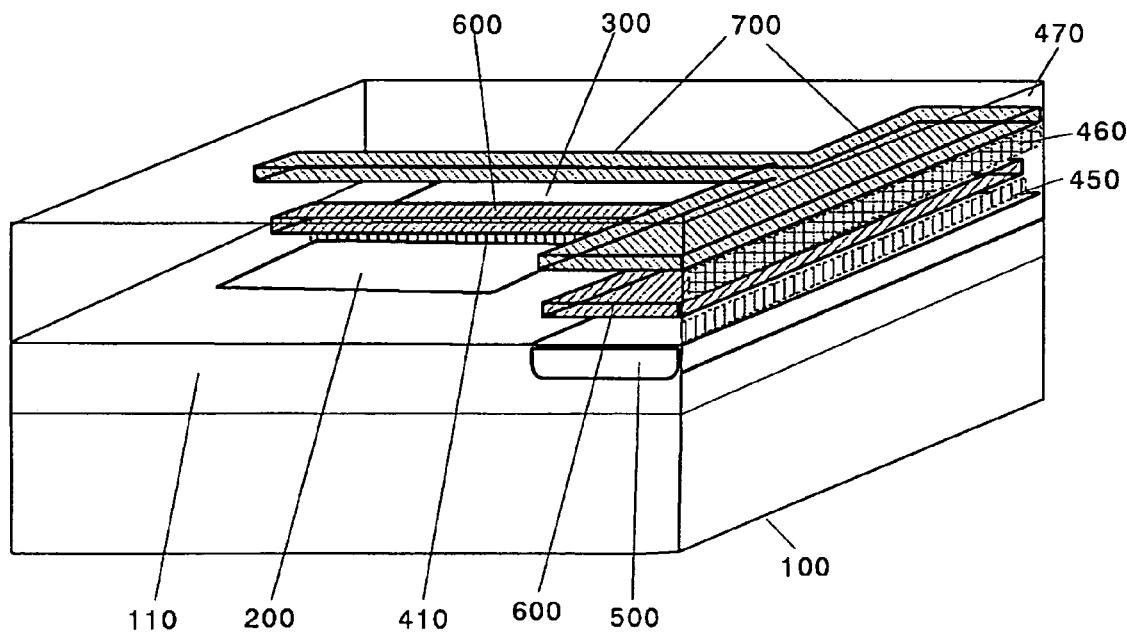
FIG. 1 is a bird's eye view of a semiconductor device in accordance with Embodiment 1.

A floating gate non-volatile memory of the present invention can be implemented with the following structure. That is, the floating gate non-volatile memory is constituted by: a substrate; a channel forming semiconductor region of a first conductivity type, which is provided in a substrate surface region of the substrate; a source region and a drain region, which are spaced from each other by sandwiching the channel forming semiconductor region therebetween and provided in the substrate surface region; a gate insulating film provided on the channel forming semiconductor region; a single crystal control region, which is electrically separated from the channel forming region and provided in the substrate surface region; a control gate insulating film provided on the single crystal control region; a floating gate, which is provided on the gate insulating film and which is extended onto the control gate insulating film to have capacitive coupling electrically with the single crystal control region; a shield insulating film provided on the floating gate; and a shield conductive film, which is provided on the shield insulating film and has capacitive coupling with the floating gate.

The shield insulating film needs to be formed directly above a wafer including the floating gate by a deposition method, in which neutral molecules/atoms come flying. Specifically, there is used the insulating film formed by thermal CVD, radical CVD, catalytic CVD, or thermal oxidization.

In the case where the substrate is a semiconductor substrate, the single crystal control region can be formed to be spaced from the channel forming semiconductor region, as a region of an opposite conductivity type to the substrate surface region.

In the case where the substrate is constituted by a supporting substrate and a semiconductor layer insulated from the supporting substrate and the semiconductor layer forms the substrate surface region, the single crystal control region is spaced from the channel forming semiconductor region with an insulating film in between and can be a region of either a p-type or n-type.

If necessary, a specified potential is supplied to the shield conductive film, so a gate threshold voltage measured from the single crystal control region can be adjusted at the time of reading.

A specified potential, which has the same sign as that of a supply potential to the single crystal control region, can be supplied to the shield conductive film at the time of writing. Thus, an electric field applied to the shield insulating film at the time of writing is relaxed, thereby enabling improvement of reliability. Further, a requirement to a withstand voltage required for the single crystal control region can be relaxed.

One of the specified potentials having the same sign as that of a supply potential to the single crystal control region, having an opposite sign to that of a supply potential to the source region, and having an opposite sign to that of a supply potential to the drain region, is supplied to the shield conductive film at the time of erasure. Thus, the absolute value of the potential supplied to at least one of the three regions can be reduced at the time of erasure. Therefore, the withstand voltages required for the three regions can be relaxed.

Embodiment 1

FIG. 1 is a bird's eye/sectional view in accordance with Embodiment 1 of the present invention. In the figure, reference numeral 100 denotes a semiconductor substrate, and reference numeral 110 denotes a substrate surface region of a first conductivity type, which takes what is called a well structure. Reference numeral 200 denotes a source region of an opposite conductivity type; 300 denotes a drain region of the opposite conductivity type; and 410 denotes a gate insulating film formed on a channel forming semiconductor region. The channel forming semiconductor region (not shown in the figure), which is formed in a surface of the substrate surface region, is located between the source region 200 and the drain region 300 and under the gate insulating film 410. Reference numeral 500 denotes a single crystal control region of the opposite conductivity type, which is formed in the substrate surface region of the first conductivity type; 450 denotes a control gate insulating film formed on the single crystal control region; 600 denotes a floating gate; 460 denotes a shield insulating film provided on the floating gate; 700 denotes a shield conductive film provided on the shield insulating film; and 470 denotes a first interlayer insulating film provided on the shield conductive film. Usually, a multilayer interconnection structure is provided on the first interlayer insulating film.

The source and drain regions are provided to be spaced from each other while the channel forming semiconductor region is sandwiched therebetween. The single crystal control region is provided to be spaced from the source region, drain region, and channel forming semiconductor region.

The so-called field insulating film is provided on the semiconductor substrate surface between the single crystal control region and the source region, drain region, and channel forming semiconductor region. The floating gate 600, which is provided on the gate insulating film 410, is extended onto the field insulating film and further extended onto the control gate insulating film 450 on the single crystal control region.

The single crystal control region has a rectifier junction with respect to the semiconductor substrate. In the case where the single crystal control region is of an n-type, the source region and the drain region each are also of the n-type while the substrate surface region is of a p-type. At this point, the single crystal control region has an operational range with a positive potential with respect to the substrate surface region. Hereinafter, polarities of voltages will be described based on this case. In the case of the source and drain regions of the p-type, the following description can be applied by inverting the voltage polarity and making a comparison with an absolute value on a value relation.

Writing of a floating gate non-volatile memory can be performed by channel hot electron injection or FN (Fowler-Nordheim) tunnel injection of electrons from the channel forming semiconductor region.

The channel hot electron injection can be carried out by supplying a voltage of 0 V to the source region, 4 to 5 V to the drain region, and 10 to 12 V to the single crystal control region, respectively. In this case, the writing speed is fast, but a large current of the order of 100 μA flows from the source region to the drain region.

The FN tunnel injection can be carried out by supplying a voltage of 0 V to the source region or drain region and 14 to 16 V to the single crystal control region, respectively. In this case, a large current does not flow, but the writing speed is slow.

In the case where the floating gate non-volatile memory is arranged in an array shape, a high voltage (10 to 16 V) may be applied to the single crystal control region of a memory cell to which writing is not intended in some cases. A voltage of 4 to 5 V is supplied to the source region of the memory cell in order to inhibit the writing.

Erasure of the floating gate non-volatile memory is performed by supplying a potential of approximately 10 V to one or both of the source region and the drain region.

In order to relax an electric field applied to the shield insulating film at the time of writing, an auxiliary bias (for example, the specified potential is set to 9 to 12 V) can be supplied to the shield conductive film. As a result, the voltage at the single crystal control region can be lowered (for example, 7 to 12 V). A junction withstand voltage of the single crystal control region is relaxed. Thus, there is obtained a large practical effect in terms of miniaturization of MOS•IC/LSI.

A bias (for example, the specified potential is set to 0 to 1.5 V) for adjusting a gate threshold voltage to, for example, 0 to 0.5 V, measured from the single crystal control region at the time of reading can be supplied to the shield conductive film.

An auxiliary bias (for example, the specified potential is set to −6 V) is supplied to the shield conductive film at the time of erasure, thereby being capable of lowering the potential supplied to the drain or source region to approximately 8 V. A junction withstand voltage at the drain region or the source region can be lowered. Thus, there is obtained a large practical effect in terms of miniaturization of MOS•IC/LSI.

In order to control defects in and growth rate of the control gate insulating film, a surface impurity concentration of the single crystal control region is set to an order of $10^{19}$ atoms/cc or less. At this point, the control gate insulating film and the gate insulating film can be simultaneously formed through thermal oxidization. When thermal oxidization is performed with a condition for obtaining a gate insulating film with a thickness of 80 nm for a typical thickness, the control gate insulating film nearly has a thickness of 90 nm.

For the shield insulating film, there can be used a high temperature (about 600 to 700° C.) thermal CVD oxide film formed by using, for example, silane or organic silane and nitrogen oxide as source gases. The thickness of about 250 nm can realize the withstand voltage at the time of writing.

The shield conductive film can be formed by using local interconnection materials, for example, polysilicon and titanium nitride. In the case no local interconnection process is available, a first metal layer material can also be used.

As to the process after the provision of the shield conductive film, even if an interlayer insulating film or plasma silicon nitride film for passivation is formed by using plasma CVD, this does not affect the threshold voltage of the floating gate non-volatile memory in embedded application.

Embodiment 2

Figure 2:
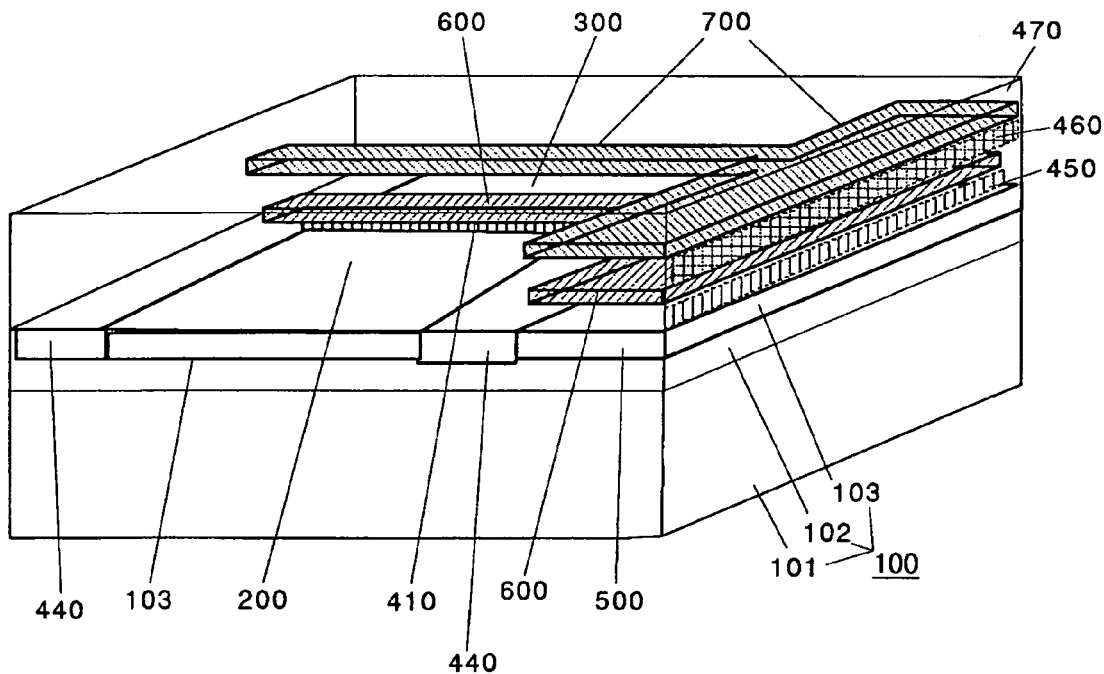
FIG. 2 is a bird's eye view of a semiconductor device in accordance with Embodiment 2 in which an SOI substrate is used.

FIG. 2 is a bird's eye sectional view in accordance with Embodiment 2 of the present invention. In Embodiment 2, the present invention is implemented to the SOI (semiconductor on insulator) substrate 100 which is constituted by a supporting substrate 101 and a semiconductor layer 103 insulated from the supporting substrate by what is called a BOX insulating layer 102. The semiconductor layer 103 constitutes the substrate surface region. The same reference numerals as those in FIG. 1 denote the regions with the same functions.

In this embodiment, the single crystal control region 500 is literally insulated from the source region 200, drain region 300, and channel forming semiconductor region 111 (not shown in the figure) by a field insulating film 440. Therefore, the single crystal control region 500 may be of either a p-type or n-type. Further, operation can be performed with voltages of both positive and negative polarities. Thus, writing and erasure can be carried out by applying electrical potentials with different polarities to the single crystal control region. That is, when writing is performed with the single crystal control region at a positive potential (for example, 14 to 16 V) with regard to the channel forming semiconductor region, erasure can be performed with a negative potential having the same absolute value as the positive potential. The other points related to the bias are the same as those in Embodiment 1. The supply effect of the specified potential to the shield conductive layer is the same as that in Embodiment 1.

What is claimed is:

1. A floating gate non-volatile memory comprising:
   a substrate;
   a channel forming semiconductor region of a first conductivity type disposed in a substrate surface region of the substrate;
   a source region and a drain region each disposed in the substrate surface region, the source and drain regions being spaced from each other with the channel forming semiconductor region disposed therebetween;
   a gate insulating film disposed on the channel forming semiconductor region;
   a single crystal control region electrically separated from the channel forming semiconductor region and disposed in the substrate surface region;
   a control gate insulating film disposed on the single crystal control region;
   a floating gate disposed on the gate insulating film and extending onto the control gate insulating film so as to be capacitively coupled with the single crystal control region;
   a chemical-vapor-deposited shield insulating film formed in a gas atmosphere charge-balanced on the floating gate; and
   a shield conductive film disposed on the chemical- vapor-deposited shield insulating film and capacitively coupled with the floating gate.

2. A floating gate non-volatile memory according to claim 1; wherein the substrate comprises a semiconductor substrate; and wherein the single crystal control region is spaced from the channel forming semiconductor region and has a conductivity type opposite to that of the substrate surface region.

3. A floating gate non-volatile memory according to claim 1; wherein the substrate comprises a supporting substrate and a semiconductor layer insulated from the supporting substrate and forming the substrate surface region, the channel forming semiconductor region being formed at a part of the semiconductor layer; and wherein the single crystal control region is spaced from the channel forming semiconductor region by an insulating film.

4. A floating gate non-volatile memory according to claim 1; wherein the shield conductive film is supplied with a preselected potential at a time of reading from the floating gate non-volatile memory to adjust a gate threshold voltage measured from the single crystal control region.

5. A floating gate non-volatile memory according to claim 1; wherein the shield conductive film receives a preselected potential having the same sign as that of a supply potential supplied to the single crystal control region at a time of writing to the floating gate non-volatile memory.

6. A floating gate non-volatile memory according to claim 1; wherein at a time of erasing from the floating gate non-volatile memory, the shield conductive film receives one of a preselected potential having the same sign as that of a supply potential supplied to the single crystal control region, a preselected potential having a sign opposite to that of a supply potential supplied to the source region, and a preselected potential having a sign opposite to that of a supply potential supplied to the drain region.

7. A floating gate non-volatile memory according to claim 1; wherein the chemical-vapor-deposited shield insulating film comprises a thermal-chemical-vapor-deposited shield insulating film.

8. A floating gate non-volatile memory according to claim 1; wherein the chemical-vapor-deposited shield insulating film comprises a radical-chemical-vapor-deposited shield insulating film.

9. A floating gate non-volatile memory according to claim 1; wherein the chemical-vapor-deposited shield insulating film comprises a photo-assisted-chemical-vapor-deposited shield insulating film.

10. A floating gate non-volatile memory comprising:
a substrate having a surface region;
a channel forming semiconductor region disposed in the surface region of the substrate;
a source region and a drain region each disposed in the surface region of the substrate, the source and drain regions being spaced apart from each other with the channel forming semiconductor region disposed therebetween;
a gate insulating film disposed on the channel forming semiconductor region;
a single crystal control region disposed in the surface region of the substrate and electrically separated from the channel forming semiconductor region;
a control gate insulating film disposed on the single crystal control region;
a floating gate disposed on the gate insulating film and on the control gate insulating film and capacitively coupled with the single crystal control region;
a chemical-vapor-deposited shield insulating film formed in a charged-balanced gas atmosphere and disposed on the floating gate; and
a shield conductive film disposed on the chemical-vapor-deposited shield insulating film and capacitively coupled with the floating gate.

11. A floating gate non-volatile memory according to claim 10; wherein the charge-balanced chemical-vapor-deposited shield insulating film is formed by charge-balancing a gas atmosphere on the floating gate.

12. A floating gate non-volatile memory according to claim 10; wherein the chemical-vapor-deposited shield insulating film comprises a thermal-chemical-vapor-deposited shield insulating film.

13. A floating gate non-volatile memory according to claim 10; wherein the chemical-vapor-deposited shield insulating film comprises a radical-chemical-vapor-deposited shield insulating film.

14. A floating gate non-volatile memory according to claim 10; wherein the chemical-vapor-deposited shield insulating film comprises a photo-assisted-chemical-vapor-deposited shield insulating film.

15. A floating gate non-volatile memory according to claim 10; wherein the substrate comprises a semiconductor substrate; and wherein the single crystal control region is spaced from the channel forming semiconductor region by an insulating film and has a conductivity type opposite to that of the substrate surface region.

16. A floating gate non-volatile memory comprising:
a substrate comprised of a supporting substrate and a semiconductor layer insulated from the supporting substrate;
a channel forming semiconductor region disposed in the semiconductor layer;
a source region and a drain region each disposed in the semiconductor layer, the source and drain regions being spaced apart from each other with the channel forming semiconductor region disposed therebetween;
a gate insulating film disposed on the channel forming semiconductor region;
a single crystal control region disposed in the semiconductor layer and electrically separated from the channel forming semiconductor region by an insulating film;
a control gate insulating film disposed on the single crystal control region;
a floating gate disposed on the gate insulating film and on the control gate insulating film and capacitively coupled with the single crystal control region;
a chemical-vapor-deposited charge-balanced shield insulating film disposed on the floating gate; and
a shield conductive film disposed on the chemical-vapor-deposited charge-balanced shield insulating film and capacitively coupled with the floating gate.

17. A floating gate non-volatile memory according to claim 10; further comprising an insulating film disposed between the single crystal control region and the channel forming semiconductor region.

18. A floating gate non-volatile memory according to claim 16; wherein the chemical-vapor-deposited charge-balanced shield insulating film comprises one of a thermal-chemical-vapor-deposited charge-balanced shield insulating film, a radical-chemical-vapor-deposited charge-balanced shield insulating film, and a photo-assisted-chemical-vapor-deposited charge-balanced shield insulating film.

19. A floating gate non-volatile memory according to claim 1; wherein the chemical-vapor-deposited shield insulating film is formed in the gas atmosphere charge-balanced on the floating gate so that an electric charge included into the chemical-vapor-deposited shield insulating film is reduced to a level that does not cause variation of a gate threshold voltage of the floating gate non-volatile memory.

20. A floating gate non-volatile memory according to claim 1; wherein the floating gate comprises a poly-crystalline floating gate.

21. A floating gate non-volatile memory according to claim 3; wherein the single crystal control region is biased in a different polarity voltage during writing and erasing.

22. A floating gate non-volatile memory according to claim 10; wherein the floating gate comprises a poly-crystalline floating gate.

23. A floating gate non-volatile memory according to claim 16; wherein the floating gate comprises a poly-crystalline floating gate.

24. A floating gate non-volatile memory according to claim 16; wherein at a time of erasing from the floating gate non-volatile memory, the shield conductive film receives one of a preselected potential having the same polarity as that of a supply potential supplied to the single crystal control region, a preselected potential having a polarity opposite to that of a supply potential supplied to the source region, and a preselected potential having a polarity opposite to that of a supply potential supplied to the drain region.

* * * * *